(12) United States Patent
Han (10) Patent No.: US 11,152,857 B2
(45) Date of Patent: Oct. 19, 2021

(54) GATE DRIVER CIRCUIT FOR HALF BRIDGE MOSFET SWITCHES PROVIDING PROTECTION OF THE SWITCH DEVICES

(71) Applicant: Flextronics AP, LLC, San Jose, CA (US)

(72) Inventor: Hyeong Han, Markham (CA)

(73) Assignee: Flextronics AP, LLC, San Jose, CA (US)

( * ) Notice: Subject to any disclaimer, the term of this patent is extended or adjusted under 35 U.S.C. 154(b) by 96 days.

(21) Appl. No.: 14/705,802

(22) Filed: May 6, 2015

(65) Prior Publication Data

US 2016/0329808 A1 Nov. 10, 2016

(51) Int. Cl.
| | |
|---|---|
| *H02M 3/158* | (2006.01) |
| *H02M 1/38* | (2007.01) |
| *H02M 1/08* | (2006.01) |
| *H02M 1/36* | (2007.01) |
| *H02M 7/5387* | (2007.01) |
| *H03K 17/082* | (2006.01) |

(52) U.S. Cl.
CPC .............. *H02M 3/158* (2013.01); *H02M 1/08* (2013.01); *H02M 1/38* (2013.01); *H03K 17/0822* (2013.01); *H02M 1/36* (2013.01); *H02M 7/5387* (2013.01); *H03K 2217/0072* (2013.01)

(58) Field of Classification Search
CPC . H02M 1/38; H02M 3/158; H02M 2001/0029
See application file for complete search history.

(56) References Cited

U.S. PATENT DOCUMENTS

| | | | | |
|---|---|---|---|---|
| 5,627,460 | A * | 5/1997 | Bazinet | ................... G05F 1/618 323/224 |
| 6,307,409 | B1 | 10/2001 | Wrathall | |
| 6,396,250 | B1 * | 5/2002 | Bridge | ................ H02M 3/1588 323/283 |
| 7,187,226 | B2 * | 3/2007 | Audy | ....................... H02M 1/38 326/27 |
| 2005/0110475 | A1 * | 5/2005 | Chapuis | ................... H02M 1/38 323/282 |
| 2011/0006698 | A1 * | 1/2011 | Langeslag | .......... H05B 41/2985 315/226 |
| 2011/0187439 | A1 * | 8/2011 | Sugie | ................... H03K 17/687 327/424 |

(Continued)

*Primary Examiner* — Thienvu V Tran
*Assistant Examiner* — Bart Iliya
(74) *Attorney, Agent, or Firm* — Volpe Koenig (57) ABSTRACT

A gate driver circuit which may include an input; high-side and low-side outputs; a signal conversion circuit configured to generate a high-side drive signal at the high-side output such that a delay time separates a transition of the high-side drive signal and a transition of a low-side drive signal at the low-side output; and a monitoring circuit configured to monitor a voltage at an output of a half-bridge and to pull the low-side output to a level for turning off a low-side switching device of the half-bridge on a condition that the voltage exceeds a voltage threshold. The monitoring circuit may control the low-side drive signal such that the delay time is a minimum delay necessary to prevent shoot-through of the half-bridge. The signal conversion circuit may generate the high-side drive signal such that the delay time is a minimum delay necessary to prevent shoot-through of the half-bridge.

20 Claims, 8 Drawing Sheets

(56) References Cited

U.S. PATENT DOCUMENTS

| | | | |
|---|---|---|---|
| 2012/0007637 A1* | 1/2012 | Fukuda | H02M 3/1588 327/110 |
| 2012/0038391 A1* | 2/2012 | Lee | H02H 7/122 327/109 |
| 2012/0043950 A1* | 2/2012 | Truong | H02M 3/158 323/282 |
| 2013/0215653 A1* | 8/2013 | Kihara | H02M 7/5387 363/56.01 |
| 2016/0105111 A1* | 4/2016 | Yang | H02M 3/1563 323/271 |
| 2016/0154037 A1* | 6/2016 | Kasturi | G01R 19/16538 323/271 |
| 2016/0277008 A1* | 9/2016 | Green | H02M 3/158 |

* cited by examiner

GATE DRIVER CIRCUIT FOR HALF BRIDGE MOSFET SWITCHES PROVIDING PROTECTION OF THE SWITCH DEVICES

FIELD OF INVENTION

The invention relates to gate drive circuits, and more particularly to a gate drive circuit for half bridge field effect transistors (FETs).

BACKGROUND

Field effect transistors (FETs), including metal oxide semiconductor field effect transistors (MOSFETs), are used as power switching elements in many applications. One example application of includes a half-bridge circuit which incorporates two FETs serially connected between power supply rails. Typically, each FET will be driven by a gate driver for various reasons further described herein.

There are generally two types of gate driver designs in current use for driving FETs in half bridge circuits. One type of gate driver circuit may be implemented on a silicon substrate and may be referred to as a gate driver integrated circuit (IC). Another type of gate driver circuit may be implemented on a printed circuit board (PCB) using general purpose components (e.g. as part of a control module) and may be referred to as a general purpose components based (GCB) gate driver.

A gate driver IC may provide a driving function (as further discussed herein), and may also provide a protection function (as further discussed herein) to protect switching devices such as FETs. A gate driver IC may not permit flexibility in certain of its device characteristic specifications however, and may be high in cost. Accordingly, gate driver IC applications may be limited.

A GCB gate driver, implemented using conventional technologies, may permit more flexibility in design but may require additional components for protecting for the low side FET of the half bridge (i.e. the FET connected to ground). Such components may include a shunt resistor and/or an operational amplifier (OP Amp), and may also require two separate gate signals to create a dead time offset between the transitions of switching of the FETs for shoot-through protection. Applying an additional shunt resistor for a half bridge configuration may however require the use of relatively lower Rds(on) FETs (i.e. FETs having a lower drain-source resistance) in order to compensate for the increased circuit path resistance and to permit the half bridge switch to deliver an equivalent voltage output. Further, implementing a number of gate signal pairs having a particular dead time offset may require the gate drive of the FETs to be provided using a microcontroller unit (MCU) having timer features capable of producing one or more pairs of PWM signals having offsets between each transition (i.e. offsets between transitions of a gate drive signal provided to the FET connected to ground and of a gate drive signal provided to the FET connected to the power rail). All of these requirements may lead to increased cost.

SUMMARY

A gate driver circuit which may include an input; a high-side output; a low-side output; a signal conversion circuit configured to generate a high-side drive signal at the high-side output such that a delay time separates a transition of the high-side drive signal and a transition of a low-side drive signal at the low-side output; and a monitoring circuit configured to monitor a voltage at an output of a half-bridge and to pull the low-side output to a level for turning off a low-side switching device of the half-bridge on a condition that the voltage exceeds a voltage threshold. The monitoring circuit may control the low-side drive signal such that the delay time is a minimum delay necessary to prevent shoot-through of the half-bridge. The signal conversion circuit may generate the high-side drive signal such that the delay time is a minimum delay necessary to prevent shoot-through of the half-bridge.

BRIEF DESCRIPTION OF THE DRAWING(S)

A more detailed understanding may be had from the following description, given by way of example in conjunction with the accompanying drawings wherein.

DETAILED DESCRIPTION OF THE PREFERRED EMBODIMENT(S)

Aspects of the invention may relate to a GCB gate driver which provides protection of FETs from a short without requiring a shunt resistor installed on the low side switch current path, and/or without requiring an offset between gate signal pairs.

Figure 1:
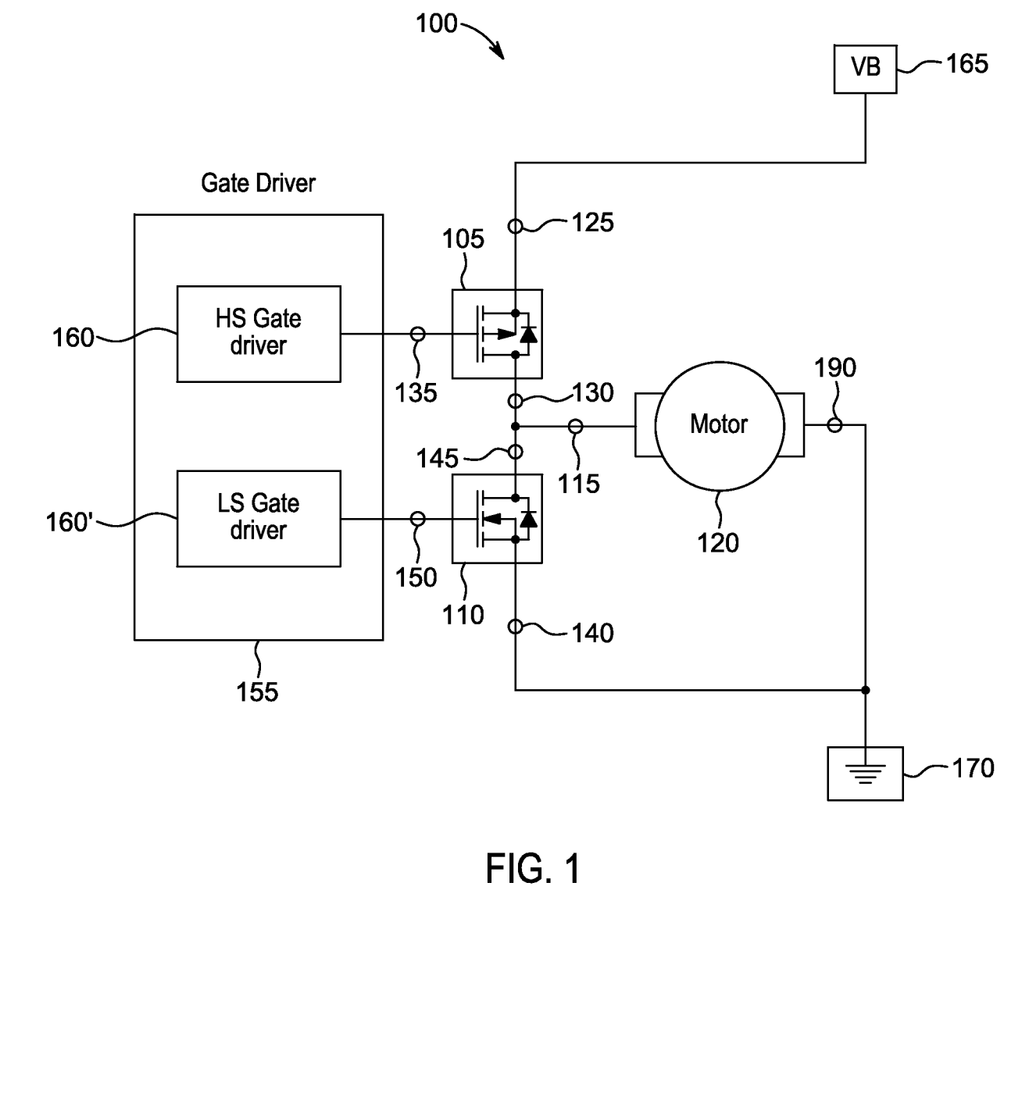
FIG. 1 is a schematic diagram of a half-bridge circuit.

FIG. 1 is a schematic diagram of a half-bridge circuit 100. Circuit 100 includes P-channel (P-ch) FET 105 and N-channel (N-ch) FET 110 connected to a first terminal 115 of motor 120. P-ch FET 105 may include source 125, drain 130, and gate 135 terminals. N-ch FET 110 may include source 140, drain 145, and gate 150 terminals. Gate terminals 135 and 150 may be driven by gate driver 155. Gate drive 155 may include a high-side gate driver 160 and a low-side gate driver 160'.

This configuration of switching elements (i.e. FETs 105, 110) may be referred to as a half bridge as discussed above. Example applications of such half bridge circuits may include electrical power conversion modules (such as a DC to DC electrical power conversion modules), or motor drive control modules for vehicle motion control systems (such as power liftgates or power window systems).

P-ch FET 105 may be used as a switch to connect positive power source 165 to the motor terminal 115 by controlling FET 105 such that a path between source 125 and drain 130 changes state from nonconductive to conductive. This may be accomplished by applying a voltage to gate 135 that is relatively lower than the voltage at source 125 of P-ch FET 105 such that the voltage difference between the source 125 and the gate 135 is greater than a threshold value of P-ch FET 105. The relatively lower voltage may be applied to gate 135 for example using gate driver 155.

N-ch FET 110 may be used as a switch to connect ground 170 to motor terminal 115 by controlling FET 110 such that a path between source 140 and drain 145 changes state from nonconductive to conductive. This may be accomplished by applying a voltage to gate 150 that is relatively higher than the voltage at source 140 of N-ch FET 110 such that the voltage difference between the source 140 and the gate 150 is greater than a threshold value of N-ch FET 110. The relatively higher voltage may be applied to gate 150 for example using gate driver 155.

P-ch FET 105 and N-ch FET 110 may be switched on or off alternately and periodically by driving the gates 135, 150 with a frequency or pulse width modulation (PWM) applied for control of motor 120. Motor 120 may be used in a vehicle motion control system for example (not shown). It is noted that circuit 100 can be converted into a full "H-bridge" circuit by the addition of an additional pair of FETs (not shown) to the opposite terminal 190 of motor 120 as is known in the art.

In general a FET may have two parasitic capacitances (not shown): one between gate and source and the other between gate and drain. During use these capacitances may result in current draw from the gate, may cause start-up delay in FET switching, and may decrease slew rate during FET switching.

Power dissipated by a FET during a transition between conductive and nonconductive states may be significantly more than power dissipated by the FET during a conductive steady-state (e.g. more than 10 times the power dissipated at conductive steady state). Thus, decreased a slew rate due to parasitic capacitance (or otherwise) may undermine the driving capability of a pair of FETs arranged in a half bridge configuration by increasing the amount of time that the FET spends in transition between conductive and nonconductive states.

To reduce the slew rate, a gate driver may be used to apply a higher voltage or higher current signal to the gate. This gate driver signal may be useful for example for applying high frequency switching to the gate of a FET. Thus one function of a gate driver may be to convert a low current or low voltage signal from a MCU to a high current or high voltage signal at the gate of the FET that is capable of transitioning the FET at a suitable slew-rate by overcoming the parasitic capacitances of each FET for each PWM cycle. This function of a gate driver may be referred to as a driving function.

It may also be desirable to ensure that both switches of a half bridge are not turned on simultaneously during operation. This is because turning on both power switches (e.g. causing both FETs 105 and 110 to become conductive) at the same time may create a short circuit condition referred as "shoot-through" by connecting the power source to ground through a low resistance path. The shoot-through condition may permit a large current to flow through the power switches (e.g. FETs 105 and 110), potentially causing overheating and damaging of the power switches or other components.

Other functions of a half bridge gate driver may thus include preventing a "shoot-through" condition from occurring (e.g. by preventing simultaneous conduction by both FETs) and/or by protecting the half bridge from a short which has already occurred by shutting off one or both switches (e.g. by driving one or both FETs to a nonconductive state) upon detection of an overload or a short and possibly by preventing re-activation of the switch afterward. These functions of a gate driver may be referred to as protective functions.

It may accordingly be desirable to provide a gate drive circuit for a half bridge configuration of FETs which is self-protective against a hard short (i.e. low resistance path resulting in a large current) and which includes detection of shorts and/or shutoff of the FETs involved to protect FETs from damage and which may be simple and/or cost-effective.

Figure 2:
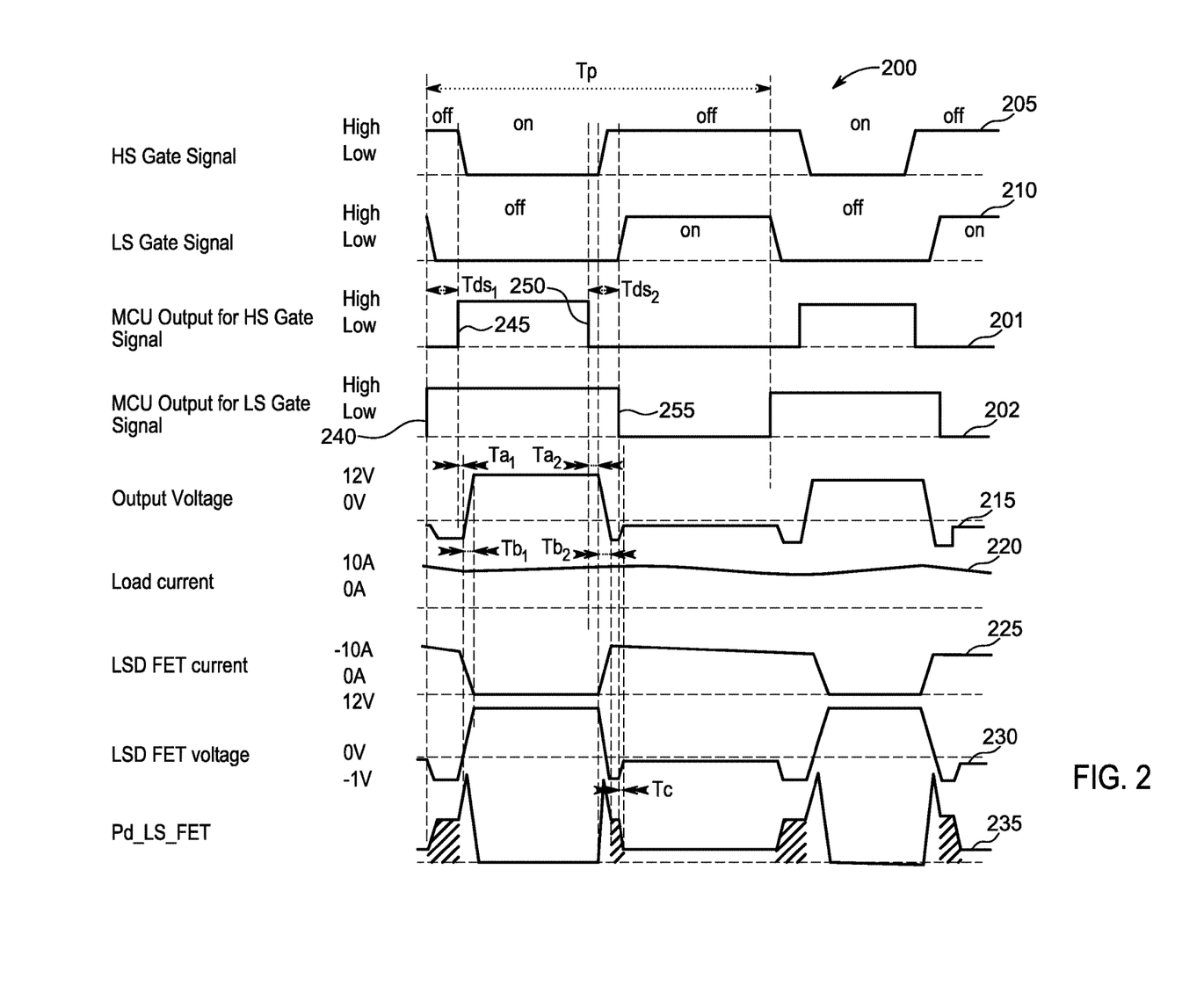
FIG. 2 is a signal diagram illustrating waveforms for the half-bridge circuit shown in FIG. 1.

FIG. 2 shows a signal diagram 200 illustrating signal waveforms for a half bridge switch driven by a conventional gate driver. In this example, the conventional gate driver corresponds to gate driver 155 and the high side switch and low side switch correspond to FET 105 and FET 110 as shown in FIG. 1 respectively.

Signal diagram 200 illustrates waveforms for MCU Output for HS Gate Signal 201, MCU Output for LS Gate Signal 202, HS Gate Signal 205, LS Gate Signal 210, Output Voltage 215, Load Current 220, LST FET current 225, LSTD FET voltage 230 and Pd_LS_FET 235. It is noted that the voltages and currents provided are exemplary. These signals are described as follows in relation to the components shown in FIG. 1. Waveform 205 (HS Gate Signal) illustrates the voltage applied to gate 135 of FET 105 by gate driver 155. Waveform 210 (LS Gate Signal) illustrates the voltage applied to gate 150 of FET 110 by gate driver 155.

$T_{ds1}$ and $T_{ds2}$ are dead time offsets applied for each PWM cycle of gate control signals in conventional gate driver designs, as illustrated in FIG. 2.

$T_{ds1}$ is a time delay from turn-off transition 240 of the MCU Output for LS Gate Signal 202, which is applied to gate driver circuit for low side switch FET of a half bridge switch, to turn-on transition 245 of MCU Output for HS Gate Signal 201, which is applied to gate drive circuit for high side switch FET of a half bridge switch. $T_{ds1}$ may be referred to as a "dead time offset for delay before push" of the gate signal pair from the source.

$T_{ds2}$ is a time delay from turn-off transition 250 of MCU output for HS Gate Signal 201 to turn-on transition 255 of MCU Output for LS Gate Signal 202, which is applied to gate driver circuit for low side switch FET of a half bridge switch. $T_{ds2}$ may be referred to as a "dead time offset for delay before pull".

$T_p$ represents the period of the PWM cycle of the gate driving signals and is shown in signal diagram 200 between the rising edges of the MCU Output for LS Gate Signal 202.

Waveform 215 (Output Voltage) illustrates the voltage at motor terminal 115 (i.e. at the drain of each of FET 105 and 110). Waveform 220 (Load Current) illustrates the current drawn by motor 120 via terminal 115. Waveform 225 (LSD FET current) illustrates the current drawn by FET 110. Waveform 230 (LSD FET voltage) illustrates FET 110 drain voltage.

$T_{a1}$ represents an activation delay of the high side switch FET 105, a delay time from rising edge 245 of MCU Output for HS Gate Signal to start of the turn-on transition of FET 105. $T_{a2}$ represents deactivation delay of high side switch FET 105, a delay time from falling edge 250 of MCU Output for LS Gate Signal to start of the turn-off transition of FET 105. $T_{b1}$ represents rising time of high side switch FET 105 and $T_{b2}$ represents falling time of high side switch FET 105. $T_{b1}$ and $T_{b2}$ may be factored by output resistances of the switch devices involved (e.g. inside-HS Gate driver 160) and/or the gate-drain capacitance of high side switch FET 105. $T_c$ represents activation delay plus rising time of low side switch FET 110.

Waveform 235 (Pd_LS_FET) illustrates the power dissipation of FET 110. The shaded areas of waveform 235 represent the energy dissipated during the portion of dead times of $T_{ds1}$ or $T_{ds2}$, during which N-ch FET 110 remains off or has not been completely turned on.

Figure 6:
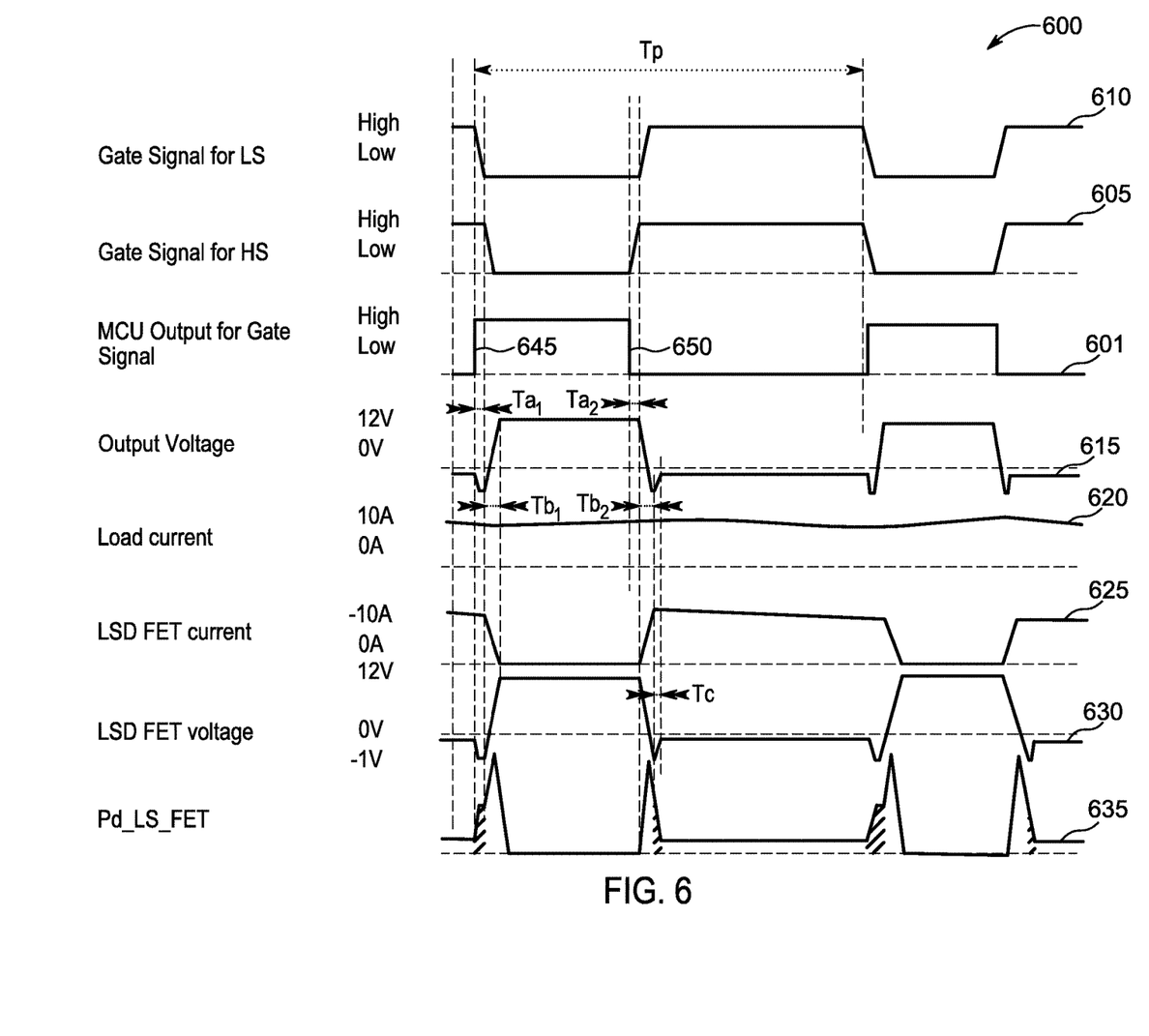
FIG. 6 is a signal diagram illustrating waveforms for the half-bridge circuit shown in FIG. 4.

It is noted that the shaded area of waveform 235 occupies a larger area of the Pd_LS_FET waveform 235 as compared with a relatively smaller shaded area of Pd_LS_FET waveform 635 in FIG. 6. This difference may be due to reduced energy dissipation in (LS FET of FIG. 6 as compared to (LS FET of FIG. 4) by elimination of dead time delay between the transitions of the signals from the source and/or minimization of delay between transitions of the high-side FET and low-side FET as further discussed herein.

Figure 3:
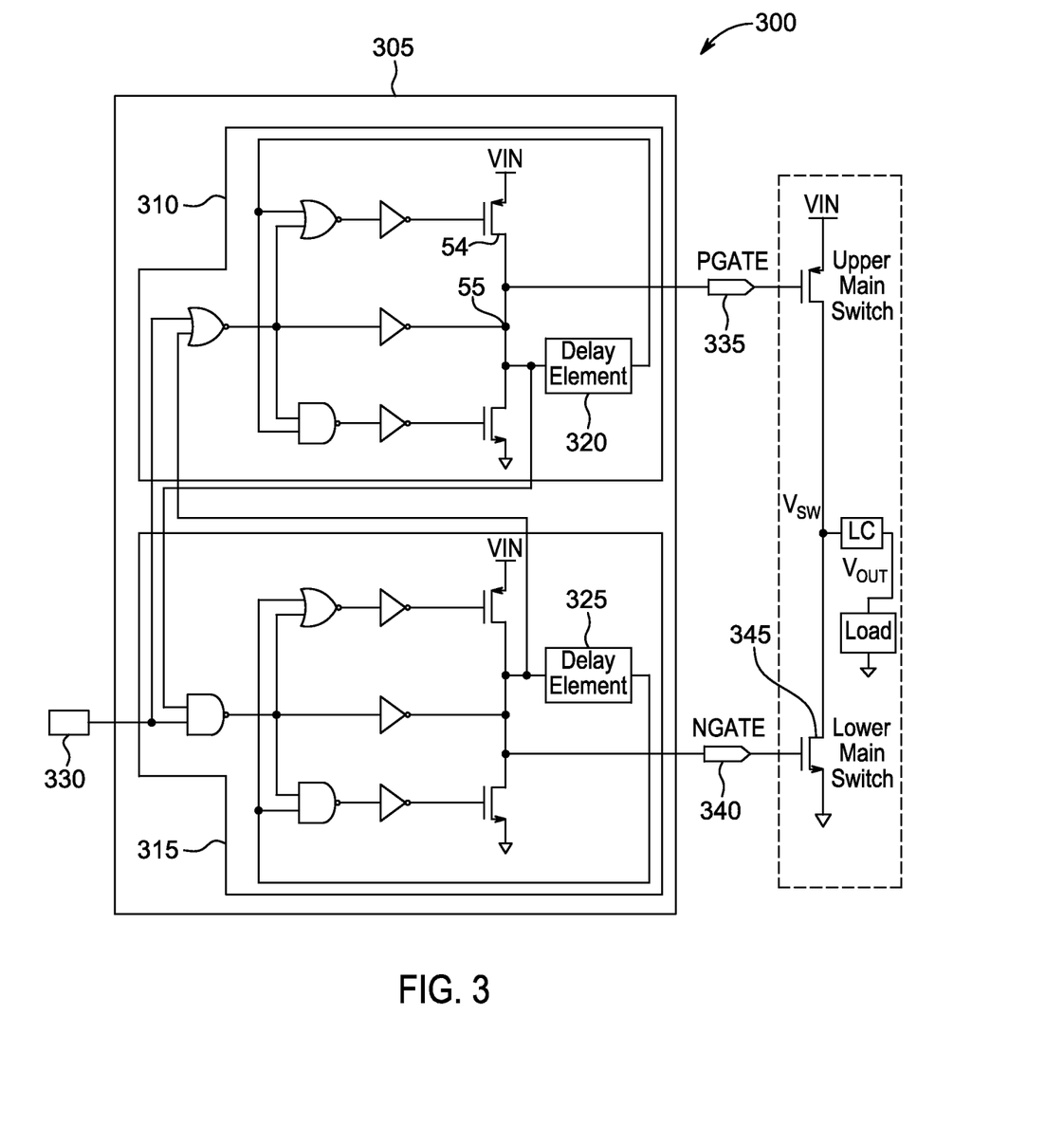
FIG. 3 is a block diagram illustrating an example circuit which includes a gate driver IC.

FIG. 3 is a block diagram illustrating an example half-bridge and driver circuit 300 containing a gate driver IC 305. Gate driver IC 305 includes a high side driver 310 and a low side driver 315 having fixed time delay blocks 320 and 325 respectively. Blocks 320 and 325 may implement dead time by passing gate drive signal 330 through a number of inverters (not shown) connected in series for example. The arrangement of FIG. 3 exemplifies fixed dead time delay applied in a gate driver IC, to introduce a propagation delay in the signal path. An example of this type of arrangement may be found for example in U.S. Pat. No. 6,307,409.

However as discussed above, a gate driver IC such as gate driver IC 305 may not provide sufficient (or any) flexibility in specifying gate driver characteristics such as slew rate or time delay between the gate signals 335 and 340 (i.e. dead time). This may be disadvantageous because slew rate and dead time may be important parameters to control in pursuing optimization when designing a power converter or motor driver circuit for example, and may result in suboptimal power dissipation in the Lower Main Switch 345.

In general, dead time provided by a gate driver IC typically must be long enough to allow the gate driver IC to be applicable for various target output drive FETs having a wide range of gate charge characteristics, whereas dead time may be set minimally or optimally for a specific FET driven by a GCB gate driver. This may be a disadvantageous feature of gate driver ICs because a longer dead time may reduce the effective dynamic range of PWM duty that may be applied to drive the FETs. Such reduced applicable PWM duty range may decrease the efficiency of a power converter or motor driver circuit for example.

Applicable PWM duty may be limited in range between "dead time rate" and 1 minus "dead time rate" as shown in Equations 1 and 2:

PWM_duty_applicable_ minimum=dead time rate=sum of dead time per PWM cycle/period= $(T_{ds1}+T_{ds2})/T_p$)      (Equation 1)

PWM_duty_applicable_maximum=1−dead time rate=1−$(T_{ds1}+T_{ds2})/T_p$)      (Equation 2)

The effective PWM duty rate thus may be expressed as shown in Equation 3:

Effective_PWM_duty_rate=PWM_duty_maximum−PWM_duty_minimum=1−2*$(T_{ds1}+T_{ds1})/T_p$)      (Equation 3)

Thus, Effective_PWM_duty_rate may be a factor which limits maximum deliverable power during PWM operation of a power switch, and dead time rate may be a dominant factor affecting power efficiency for a low side switch FET operated in PWM. Further, as discussed above the low side FET in a half bridge may dissipate significantly more power than steady on-state power during dead time (e.g. 10 times more power). This may be because the higher (e.g. 10 times) voltage drop that FET experiences during dead time when it allows a current from an inductive load (such as a DC motor of a motion control system or an inductor of a power converter) to flow through the intrinsic diode formed inside the FET, the voltage drop of which is typically 1V, which may be more than 10 times the voltage drop generally applied during a steady on state of the FET.

As discussed above, a gate driver IC may not be desirable for use in cost sensitive applications. Generally gate drive ICs are significantly more expensive than a GCB gate driver solution. However a GCB gate driver, implemented on a conventional technology applying general purpose components, may require a shunt resistor to use in the circuit applied to protect the low side switch FET, and may also require an MCU which includes a powerful timer feature capable of producing a number of PWM signals with offsets between transitions for its control device. Thus a GCB gate driver implemented using a conventional approach may also not be desirable for cost sensitive applications due to the added costs of the additional shunt resistor and specialized MCU.

Figure 4:
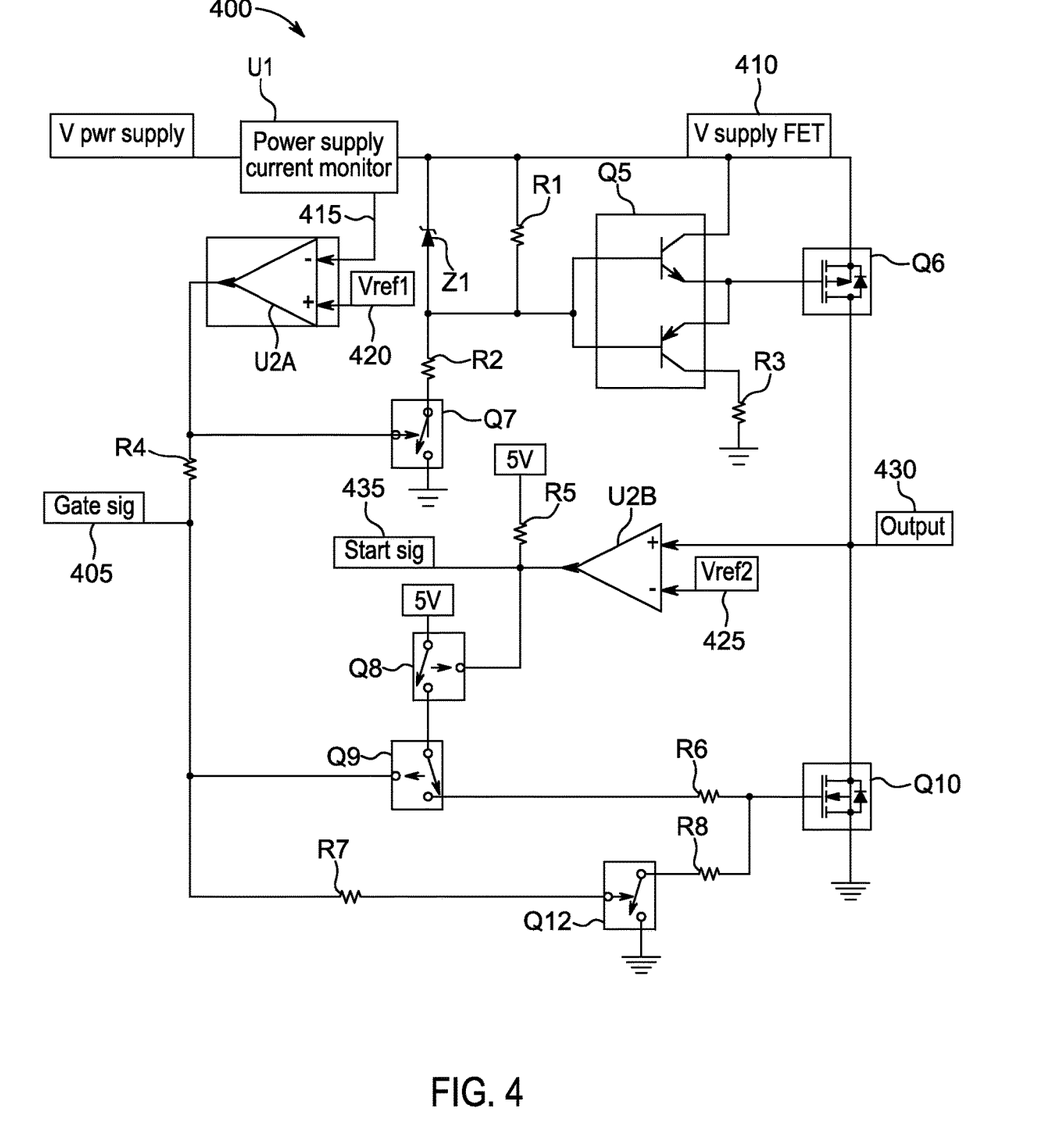
FIG. 4 is a schematic diagram of a half-bridge circuit.

FIG. 4 is a schematic diagram of a half-bridge and driver circuit 400 illustrating aspects of the invention. Circuit 400 includes P-ch FET Q6 which is used as a high-side output switch and N-ch low-side FET Q10 which is used as a low-side output switch.

A comparatively short dead time for preventing shoot-though during activation of the high side switch (FET Q6) may be achieved by passing a single gate signal 405 through the gate drive circuit for high side switch FET Q6 before applying gate signal 405 to the gate of the high side switch FET Q6 and by passing the same gate signal 405 through the gate drive circuit for low side switch FET Q10 before applying gate signal 405 to the gate of the low side switch FET Q10.

The gate drive circuit for high side switch is configured with a signal switch device Q7, resistors R4, R1, R2, and R3, zener diode Z1, and push-pull switch Q5. The gate drive circuit for low side switch FET Q6 is configured with active low signal driven switch devices Q8 and Q9, an active high signal driven switch device Q12 and resistors R7, R6, R8.

A current monitor IC U1 and a comparator and latch circuit U2A are added to the gate drive circuit for high side switch to protect the high side switch from a short. Activation of FET Q6 may be referred to as "pushing". It is noted that the signal conversion circuit may include additional components (not shown). Further details of the example conversion circuit are discussed below.

A comparatively short dead time for preventing shoot-though during activation of the low side switch (FET Q10) may be achieved using an output monitoring circuit which includes comparator IC U2B, switch devices Q8, Q9, and Q12, and resistors R5, R6, R7, and R8. It is noted that output monitoring circuit may include additional components (not shown). Activation of FET Q10 may be referred to as "pulling". The output monitoring circuit may provide shoot-through protection by creating a timing signal to allow circuit 400 begin driving FET Q10 only when the voltage at output 430 of circuit 400 becomes low enough to prevent shoot-through. The output monitoring circuit may also provide protection of FET Q10 against a short. Further details of the example output monitoring circuit are discussed below.

Switches Q7 and Q12 may each include an NPN BJT or an N-ch FET having a collector-emitter voltage or drain-source voltage rating higher than the maximum voltage at power rail 410. Push-pull switch device Q5 may include a PNP-NPN pair transistor having a higher emitter collector voltage rating than the maximum voltage applied to power rail 410. Switch devices Q9 and Q8 may each include a PNP BJT or a P-ch FET.

Zener diode Z1 may be used to limit source to gate voltage applied to P-ch FET Q6 to a voltage below a specified limit of the P-ch FET Q6. Resistor R3 may limit the current flowing from gate of FET Q6 to ground during turn-on transition. Resistor R2 may limit current flowing from the base of push-pull switch device Q5 to Q7 and prevent devices Q5 and Q7 from being overloaded where they are are driven on for activation of FET Q6. Resistor R4 may delay or slow down turning-on of Q7 in conjunction with input to output and input to ground capacitance characteristics of Q7. By adjusting values of R4, R2, R1 and R3, delay time plus rising time range may be set for FET Q6 to get a comparatively short dead time to prevent shoot-through.

Resistor R1 may limit the current flowing into the base of the NPN BJT of driver Q5 and may limit the current flowing into gate of FET Q6 where FET Q6 is in transition for turning off. Adjusting R1 value may affect deactivation delay and falling time of FET Q6.

Current monitoring IC U1 may provide a voltage signal 415 which is proportional to the current flowing through FET Q6.

Comparator and latch circuit U2A may include a comparator IC having a positive pin connected to a reference voltage 420 and a negative pin connected to the proportional signal 415 which is output from current monitoring IC U1. An output pin of a comparator and latch circuit U2A is connected to an input of switch Q7 (e.g. the gate of Q7 if switch Q7 is a FET).

The negative pin of comparator and latch circuit U2A may also be connected to a pull-up to a source as shown e.g. in FIG. 4A. The output of comparator and latch circuit U2A may maintain an active low state upon detection of a short by comparing proportional signal 415 with reference voltage 420 and shuts off the high side switch (FET Q6) by pulling the signal provided to switch Q7 down to ground.

Figure 7:
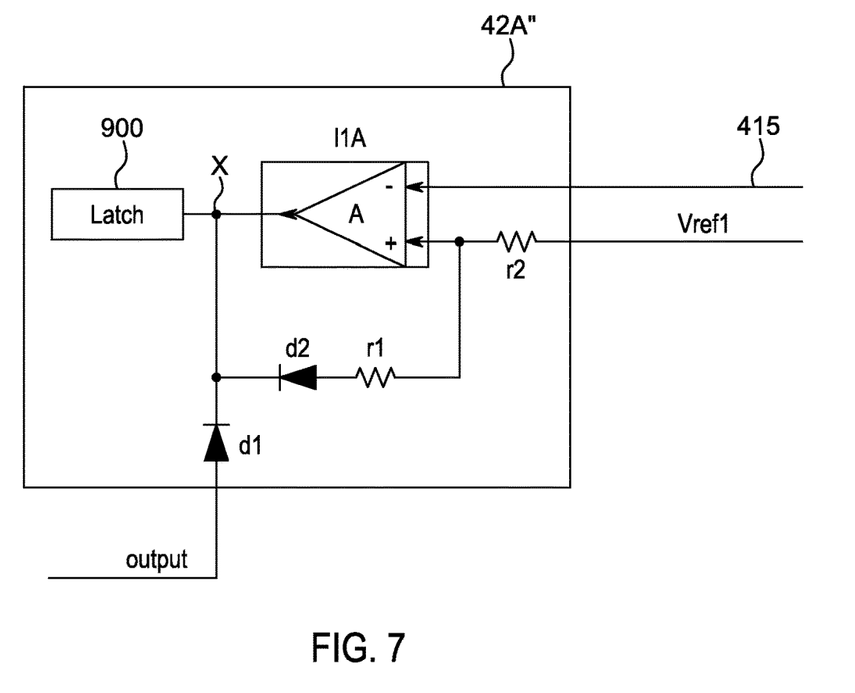
FIG. 7 is a schematic diagram showing an example comparator and latch circuit useable with the half-bridge circuit of FIG. 4.
Figure 8:
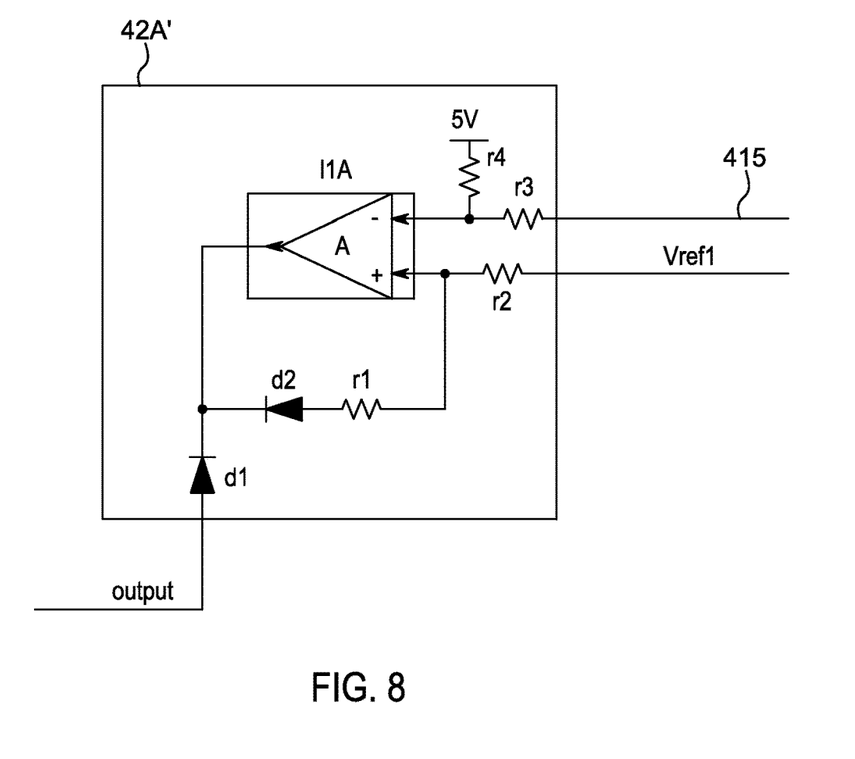
FIG. 8 is a schematic diagram showing another example comparator and latch circuit useable with the half-bridge circuit of FIG. 4.
Figure 9:
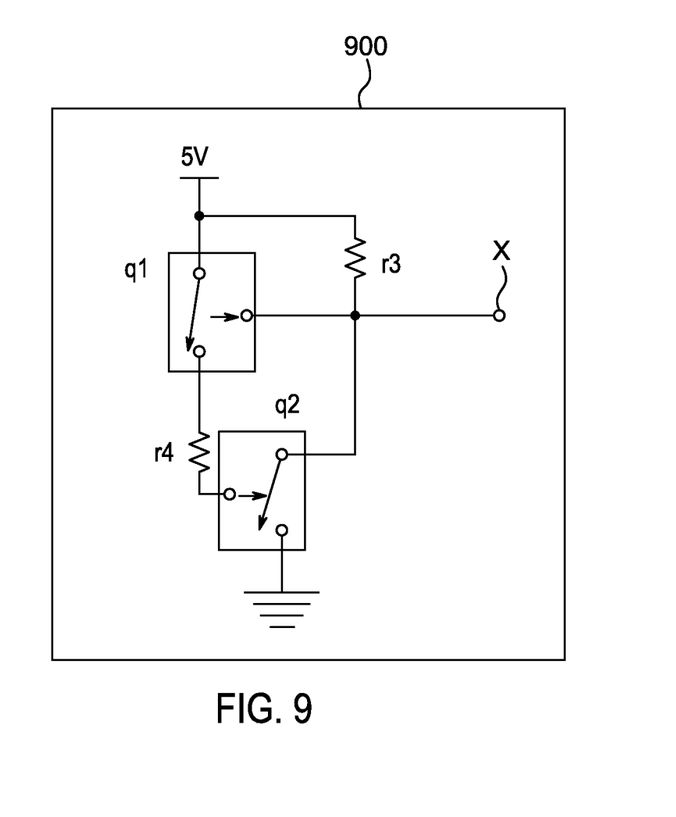
FIG. 9 is a schematic diagram showing an example latch circuit useable with comparator and latch circuits shown in FIGS. 7 and 8.

It is noted that comparator and latch circuit U2A may be implemented in various ways, as will be understood by those having skill in the art. For example, FIGS. 7 and 8 illustrate example implementations U2A' and U2A" respectively. FIG. 9 illustrates and example latch circuit 900 useable with such implementations.

Voltage comparator IC block U2B includes a negative pin connected to a reference voltage 425 and a positive pin connected to the half bridge switch output 430. Voltage comparator IC U2B also includes an output pin connected to the input of switch Q8 (e.g. the base of Q8 if Q8 is BJT or the gate of Q8 if Q8 is a FET). This arrangement may convert gate signal 405 to a gate signal for FET Q10 having a comparatively short delay time for each PWM operation cycle, (i.e., creates a minimum required "delay before pull"). This arrangement may also enable the comparator IC U2B to produce an inhibition signal which shuts off FET Q10 and/or prevents FET Q10 from being turned on again where a short is detected at the output 430. It is noted that in some implementations, the designations of comparator pins herein as "negative" or "positive" may be changed as appropriate.

The comparator IC U2B may provide protection of N-ch FET Q10 by comparing drain source voltage of N-ch FET Q10 with a threshold set to detect a short at the output 430 (shoot-through condition) and shutting off N-ch FET Q10 upon detecting a short. Comparator IC U2B may achieve this by disabling the switch device Q8 if the drain to source voltage of N-ch FET Q10 becomes higher than a threshold set by reference voltage 425 while N-ch FET Q10 is being driven on by gate signal 405.

Gate signal 405 may be provided by an MCU (not shown) to drive circuit 400. Start signal 435, which may be an active low pulse signal (and which may be of relatively short duration), may also be used to override an inhibited state of the gate driver driven by the output monitoring circuit described above due to a bias at the output 430 applied for diagnostic detection or any other reason.

Circuit 400 differs from circuit 100 (FIG. 1) in that a single waveform signal from a signal source (such as an MCU) may be applied to the input for the gate driver for the high side switch and the same signal is applied to the input for gate driver for the low side switch, i.e., only one gate signal may be required from the signal source. Thus, no dead time offset is applied for the signal(s) from the source, and "delay before push" (which represents time delay from the end of the turning-off of the low side switch to the start of the turning-on of the high side switch) and "delay before pull" (which represents the time delay from the end of the turning-off of the high side switch to the start of the turning-on of the low side switch) are introduced by circuit 400, which may prevent shoot-though from occurring. These effects are further discussed herein.

When a step signal is provided to gate of a FET, the current passes through an RC (resistor and capacitor) series network formed by the output resistance of the driver circuit and the gate-source capacitance of the FET, causing a time delay from the start of the step signal to the time the gate voltage of the FET reaches a transition threshold for the FET.

Equation 4 may be used to calculate activation delay—a time for gate voltage of the FET having a transition threshold of Vth to reach the threshold voltage when a step signal of $V_s$ amplitude is applied.

$$Vs \cdot \left(1 - e^{-\frac{Dt}{Tc}}\right) = Vth \quad \text{(Equation 4)}$$

Here, $D_t$ is delay time and $T_c$ is a time constant calculated as a product of the output resistance of the source ($R_s$) multiplied by the gate-source capacitance ($C_{gs}$). The equation may be converted to solve for delay time $D_t$:

$$Dt = Tc \cdot \ln\left(\frac{Vs}{Vs - Vth}\right) \quad \text{(Equation 5)}$$

$$Dt = Rs \cdot Cgs \cdot \ln\left(\frac{Vs}{Vs - Vth}\right) \quad \text{(Equation 6)}$$

Equation 7 may be used to calculate deactivation delay—a time for gate voltage of the FET having a transition threshold of Vth to reach the threshold voltage when the signal of stepping down to ground is applied.

$$DT = Tc - \ln\left(\frac{V\_initial}{V\_initial}\right) \quad \text{(Equation 7)}$$

Equations 8 and 9 may be used to calculate the capacitor voltage of an RC network (a resistor and a capacitor connected in series) connected to a power source which shuts off abruptly.

$$Vc(t) = \text{V\_initial} \cdot e^{\frac{-t}{Tc}} \quad \text{(Equation 8)}$$

$$\text{V\_final} = \text{V\_initial} \cdot e^{\frac{-Dt}{Tc}} \quad \text{(Equation 9)}$$

Figure 5:
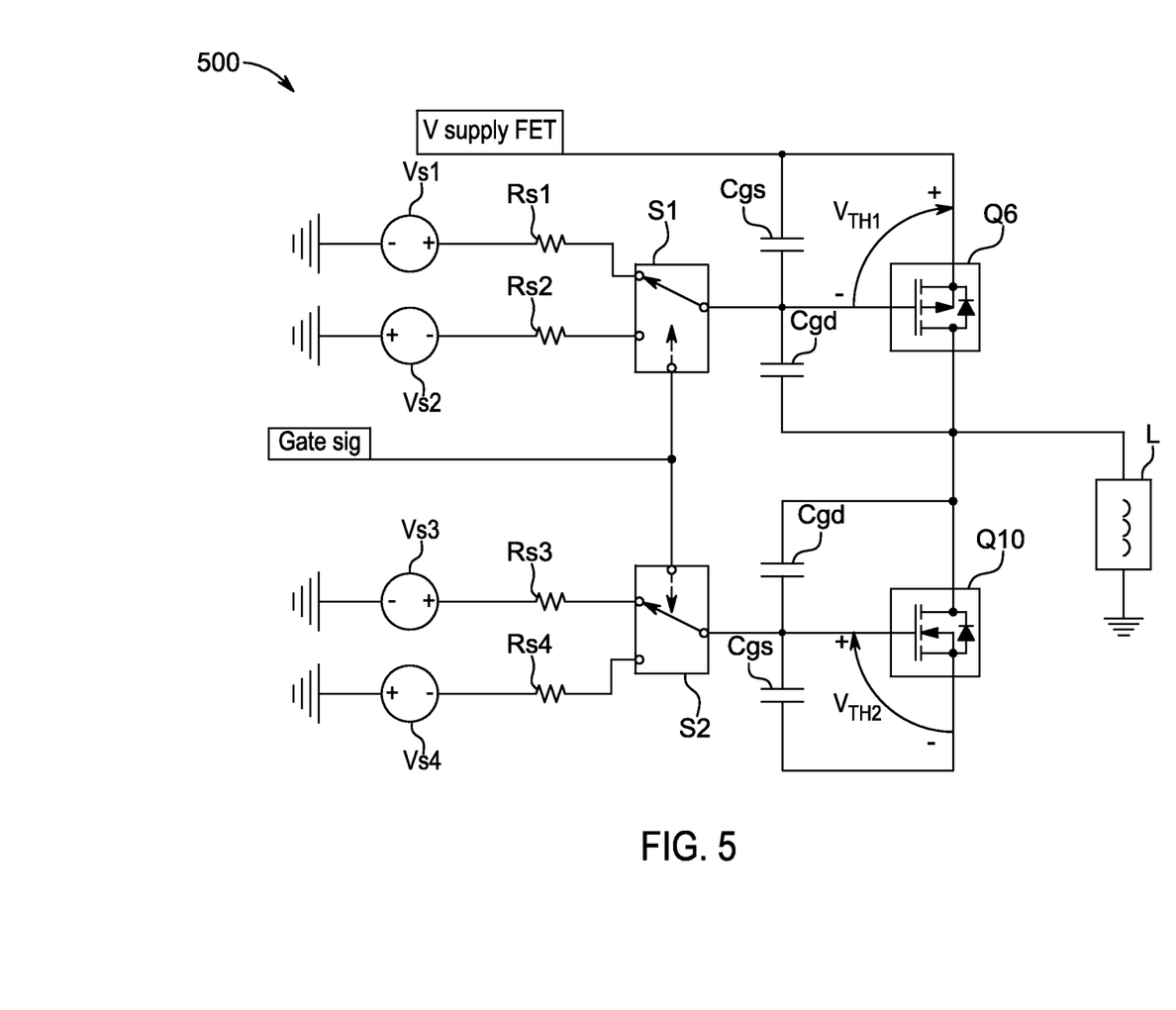
FIG. 5 is a schematic diagram showing a circuit equivalent of the half bridge circuit shown in FIG. 4.

FIG. 5 is a schematic diagram showing a circuit equivalent 500 of aspects of circuit 400. Circuit 500 shows P-ch FET Q6 and N-ch FET Q10, as well as their parasitic capacitances shown separately, Cgs1, Cgd1, Cgs2 and Cgd2.

Vs1 and Rs1 represent the source voltage and the output resistance of the signal applied to gate of FET Q6 driven by the gate drive circuit 400 while MCU Output for HS Gate Signal is inactive (Low). Vs2 and Rs2 represent the source voltage and the output resistance of the signal applied to gate of FET Q6 driven by the gate drive circuit 400 while MCU Output for HS Gate Signal is active (High). Vs3 and Rs3 represent the source voltage and the output resistance of the signal applied to gate of FET Q10 driven by the gate drive circuit 400 while MCU Output for LS Gate Signal is inactive (High). Vs4 and Rs4 represent the source voltage and the output resistance of the signal applied to gate of FET Q10 driven by the gate drive circuit 400 while MCU Output for LS Gate Signal is active (Low).

In order to introduce the "delay before push" (discussed above) required for the gate drive circuit for which a single signal is applied, a deactivation delay of low side switch FET Q10 (a time it takes before the FET starts to turn off from deactivation transition of MCU Output for LS Gate Signal) may need to be shorter than an activation delay of high side switch FET Q6 (a time it takes before the FET starts to turn on from activation transition of MCU Output for HS Gate Signal).

The descriptions below address example implementations of "delay before push". The dominant factors affecting the deactivation delay of low side switch FET Q10 are Vs3, Vs4, Rs4, Cgs2 and Vth2 (turn-on threshold voltage for Q10), which are represented in FIG. 5.

In order to calculate a value representing the deactivation delay of low side switch FET Q10, the following parameters may be applied to equation 7 to yield equation 10, where Vs4 is voltage drop at Q12 while it is active and Vs3 is applied as initial gate charge voltage.
V_initial=Vs3−Vs4
Rs=Rs4
Vth=Vth2
Tc=Rs4*Cgs2
Accordingly:

$$\text{DT\_for\_Q10\_deactivation} = Rs4 \cdot Cgs2 \cdot \ln\left(\frac{Vs3 - Vs4}{Vth2}\right) \quad \text{(Equation 10)}$$

In this example, the only independent and dominant parameter for DT_for_Q10_deactivation is Rs4. Lowering the value of Rs4 may shorten the Q10 deactivation delay. Accordingly, the value of Rs4 is set to yield a target Q10 deactivation delay.

One set of parameter values can be converted to another set of component-defining parameter values in FIG. 4 by applying definitions of the parameters. E.g.:
Rs4 represents R8.
Cgs2 represents gate-to-source charge of Q10.
Vs3 represents on-state output voltage of Q9.
Vs4_on represents on-state output voltage of Q12.
Vth2 represents turn-on threshold voltage of Q10.

In this example, the dominant factors affecting the activation delay of high side switch FET Q6 are Vs_FET, Vs2, Rs2, Cgs1 and Vth1 (turn-on threshold voltage for Q6), which are represented in FIG. 5. Vs_FET represents V_supply_FET in FIG. 4.

In order to calculate a value representing activation delay of high side switch FET Q6 the following parameters may be applied to Equation 6 to yield Equation 11:
Vs=Vs_FET−Vs2
Vth=Vth1
Tc=Rs2*Cgs1
Accordingly:

$$\text{DT\_for\_Q6\_activation} = Rs2 \cdot Cgs1 \cdot \ln\left(\frac{Vs\_FET - Vs2}{Vs\_FET - Vs2 - Vth1}\right) \quad \text{(Equation 11)}$$

The values of Rs2 and Vs2 may be set to yield a target "delay before push", which is "Q6 activation delay" minus "Q10 deactivation delay". The parameters referred to above represent component defining parameter values in FIG. 4:
Rs2 represents R3.
Cgs1 represents gate-to-source charge of Q6.
Vs2 represents "VQ7_on+(Vs_FET−VQ7_on)*R2/(R1+R2)+Vbe_Q5_PNP".
VQ7_on represents on-state output voltage of Q7.
Vth1 represents turn-on threshold voltage of Q6.

The descriptions below address example implementations of "delay before pull". The dominant factors affecting the deactivation delay of high side switch FET Q6 are Rs1, Cgs1 and Vs2, which are represented in FIG. 5. In order to calculate a value representing deactivation delay of high side switch FET Q6, the following parameters may be applied in equation 7 to yield equation 12:

$$\begin{aligned}
\text{V\_initial} &= \text{Initial Source-to-gate voltage of } Q6 \\
&= Vs\_FET - Vs2 \\
&= Vs\_Fet - \{VQ7\_on + (Vs\_Fet - VQ7\_on) * \\
&\quad R2/(R1+R2) + Vbe\_Q5\_PNP\}
\end{aligned}$$

$$\text{V\_final} = Vth1$$

$$Tc = Rs1 * Cgs1$$

Accordingly:

$$\text{DT\_for\_Q6\_deactivation} = Rs1 \cdot Cgs1 \cdot \ln\left(\frac{Vs\_fet * R1/(R1+R2) + VQ7\_on * R2/(R1+R2) - Vbe\_Q5\_PNP}{(Vth1)}\right) \quad \text{(Equation 12)}$$

The values of Rs1, R1 and R2 may be set to yield a target Q6 deactivation delay. The parameters referred to above represent the component defining parameter values in FIG. 4:
Rs1 represents "R1/(1+Hfe_Q5_NPN)".
Cgs1 represents gate-to-source charge of Q6.
Hfe_Q5_NPN represents DC current gain of Q5_NPN.

Dominant factors affecting the delay in activation of low side switch FET Q10 are Rs3, Vs3, Cgs2 and Vth2, which are shown in FIG. 5.

In order to calculate a value representing the activation delay of low side switch FET Q10, the following parameters may be applied in Equation 6 to yield equation 13:
Vs=Vs3
Vth=Vth2
Tc=Rs3*Cgs2
Accordingly:

$$DT\_for\_Q10\_activation = Rs3 \cdot Cgs2 \cdot \ln\left(\frac{Vs3}{Vs3 - Vth2}\right) \quad \text{(Equation 13)}$$

The values of Rs3 may be set to yield a target Q10 activation delay. The parameters referred to above represent component defining parameter values in FIG. 4:
Rs3 represents R6.
Cgs2 represents gate-to-source charge of Q10.
Vs3 represents on-state output voltage of Q9.
Vth2 represents turn-on threshold voltage of Q10.

While either DT_for_Q6_deactivation or DT_for_Q10_activation may be set to be minimal in order to reduce power dissipation at the switches and enhance efficiency, a "delay before pull" may be implemented by the output monitoring circuit (which includes U2B, Q8, Q9, and Q12) to generate a timing signal that allows low side switch FET Q10 to be turned on by the operation of comparator IC U2B, which compares output voltage 430 with a reference voltage 425 to confirm whether high side switch FET Q6 is turned off.

During the turn-off transition of high side switch FET Q6 where the output is connected to an inductive load, the output voltage may fall toward a given negative voltage (e.g. minus 1V). This voltage drop may occur due to the intrinsic body diode of the FET, which becomes forward-biased by inductive kick-back from the inductance of the load.

Setting reference 425 to a "low side protection threshold voltage" may provide protection of low side switch FET Q10 from a short as the output monitor circuit described above inhibits turning on low side switch FET Q10 once activation of low side switch FET for a PWM cycle is inhibited by the comparator IC's voltage comparison operation. The "low side protection threshold voltage" may be set to be greater by a margin than a worst case maximum voltage expected at the output 430 during normal operation while low side switch FET Q10 is in on state (which is due to voltage drop at FET Q10).

The configuration of the voltage comparison circuit may result in the comparator producing a timing signal that enables or disables activation of N-ch FET Q10 based on the voltage of output 430 may result in a minimum required "delay before pull" and also may enable the comparator IC to produce an inhibition signal that shuts off the FET and prevents it from being turned on again upon detection of a short at the output, thus providing a protection function.

FIG. 6 shows a signal diagram 600 illustrating signal waveforms for the circuit 400 as described with respect to FIG. 4.

Signal diagram 600 illustrates waveforms for a MCU Output for Gate Signal, MCU Output for LS Gate Signal, HS Gate Signal, LS Gate Signal, Output Voltage, Load Current, LSD FET current, LSD FET voltage and Pd_LS_FET. It is noted that the voltages provided are exemplary. These signals are described as follows in relation to the components shown in FIG. 4. Waveform 601 (MCU Output for Gate Signal) illustrates the voltage applied to R4, through which the high side switch signal is supplied to Q7 input, and R7, through which the low side switch signal is supplied to Q12 input.

Waveform 601 (MCU Output for Gate Signal) illustrates the voltage of Gate Signal 405 as shown in FIG. 4.

In contrast to signal diagram 200 of FIG. 2 (where dead time delays $T_{ds1}$ and $T_{ds2}$ are shown), signal diagram 600 does not reflect a dead time delay because a single MCU output signal 601 is applied. It is not necessary to provide dead time delay from MCU output signals in the example of FIGS. 4, 5 and 6 because the "delay before push" and "delay before pull" for circuit 400 are provided by other aspects of circuit 400 as discussed above.

$T_p$ represents the period of MCU Output for Gate Signal 601 (as shown in signal diagram 600) between the rising edges of MCU Output for Gate Signal 601. Waveform 605 (HS Gate Signal) illustrates the voltage applied to the gate of FET Q6. Waveform 610 (LS Gate Signal) illustrates the voltage applied to the gate of FET Q10.

Waveform 615 (Output Voltage) illustrates the voltage at output 430 (i.e. at the drain of each of FETs Q6 and Q10). Waveform 620 (Load Current) illustrates the current drawn by output 430. Waveform 625 (LSD FET current) illustrates the current drawn by FET Q10. Waveform 630 (LSD FET voltage) illustrates the voltage applied to drain to source of FET Q10. It is noted that output 430 may be assumed to be connected to an inductive load in some implementations.

$T_{a1}$ represents an activation delay of the high side switch FET Q6, which is a delay time from the rising edge 645 of MCU Output for Gate Signal 601 to the start of the turn-on transition of FET Q6. $T_{a2}$ represents a deactivation delay of the high side switch FET Q6, which is a delay time from the falling edge 650 of MCU output for Gate Signal 601 to the start of the turn-off transition of FET Q6. $T_{b1}$ represents the rising time of P-ch FET 105 and $T_{b2}$ represents the falling time of P-ch FET 105.

$T_{b1}$ may be factored by signal source voltage, Vs2, source resistance Rs2, and the source-drain capacitance Cgd1 of the gate driver circuit for FET Q6.

$T_{b2}$ may be factored by signal source voltage, Vs1, source resistance Rs1, and the source-drain capacitance Cgd1 of the gate driver circuit for FET Q6. $T_c$ represents the activation delay plus rising time of low side switch FET Q10. $T_c$ may be factored by Vs3, Rs3 and Cgs2 and Cdg2.

Waveform 635 (Pd_LS_FET) illustrates the power dissipation of FET Q10. The shaded areas of waveform 635 represent the energy dissipated in FET Q10 while FET Q10 remains off or has not been fully turned on. It is noted that the shaded area of waveform 635 occupies a smaller area of the Pd_LS_FET waveform 635 (FIG. 6) as compared with a relatively larger shaded area of Pd_LS_FET waveform 235 (FIG. 2). The larger shaded area reflects that the low side switch (e.g. FET 110 of FIG. 1) of a H bridge switch driven by a conventional gate driver may dissipate more energy per PWM cycle than FET Q10 of FIG. 4 due to a longer "delay before push" and "delay before pull" caused by of the dead time inserted between the transitions of the signal pair from the source.

By comparing the shaded regions under waveform 635 with the shaded regions under waveform 235 as shown in FIG. 2, it may be appreciated that a half-bridge circuit and driver configured in a manner consistent with the description of circuit 400, as shown and described with respect to FIG. 4, may have the advantage of reducing energy consumption by reducing or eliminating the Td dead time delay between input signals for the high and low switches and thus reducing or minimizing the transition time of the N-ch FET Q10 during which increased power dissipation occurs.

Although features and elements are described above in particular combinations, one of ordinary skill in the art will appreciate that each feature or element can be used alone or in any combination with the other features and elements.

What is claimed is:

1. A gate driver circuit for a half-bridge comprising:
an input;
a high-side output;
a low-side output;
a signal circuit configured to convert a gate signal to a high-side drive signal and pass the high-side drive signal to the high-side output and convert the same gate signal to a low-side drive signal and pass the low-side drive signal to the low-side output, the signal circuit comprising a monitoring circuit configured to create a delay time that separates the transition of the high-side drive signal and the transition of the low-side drive signal at the low-side output, wherein the monitoring circuit comprises a comparator and the delay time enables the comparator to compare a voltage at an output of the half-bridge to a reference voltage to confirm whether a high-side switching device of the half-bridge is turned off; and
the comparator further configured to monitor the voltage at the output of the half-bridge and to pull the low-side output to a level for turning off a low-side switching device of the half-bridge on a condition that the voltage exceeds a voltage threshold.

2. The gate driver circuit of claim 1, wherein the comparator is configured to compare the voltage at the half-bridge output to the voltage threshold and to output a control signal which initiates pulling the low-side output to a level for turning off a low-side switching device of the half-bridge on a condition that the voltage at the half-bridge output exceeds the voltage threshold.

3. The gate driver circuit of claim 1, wherein the comparator controls the low-side drive signal such that the delay time is a minimum delay necessary to prevent shoot-through of the half-bridge.

4. The gate driver circuit of claim 1, wherein the signal circuit generates the high-side drive signal such that the delay time is a minimum delay necessary to prevent shoot-through of the half-bridge.

5. The gate driver circuit of claim 1, wherein the comparator is configured to compare a signal representing current flowing through a high-side switching device of the half-bridge to a current threshold.

6. The gate driver circuit of claim 1, wherein the high-side output is in communication with a high-side switching device and the low-side output are in communication with a low-side switching device, wherein the high-side switching device, the low-side switching device, or both the low-side switching device and the high-side switching device comprise field effect transistors (FETs).

7. The gate driver circuit of claim 1, wherein the comparator comprises a start signal input which inhibits the comparator on a condition that a start signal is supplied to the start signal input.

8. A method for driving a half-bridge circuit comprising:
receiving a gate signal;
converting the gate signal to a low-side drive signal and passing the low-side drive signal to a low-side output;
converting the same gate signal to a high-side drive signal and passing the high-side drive signal to a high-side output;
monitoring, by a comparator of a monitoring circuit, a voltage at an output of the half-bridge; and
pulling, by the comparator, the low-side output to a level for turning off a low-side switching device of the half-bridge on a condition that the voltage exceeds a voltage threshold,
wherein the monitoring circuit is configured to create a delay time that separates the transition of the high-side drive signal and the transition of the low-side drive signal and the delay time enables the comparator of the monitoring circuit to compare the voltage at the output of the half-bridge to a reference voltage to confirm whether a high-side switching device of the half-bridge is turned off.

9. The method of claim 8, further comprising:
comparing, via a comparator, the voltage at the half-bridge output to the voltage threshold; and
outputting, via the comparator, a control signal which initiates pulling the low-side output to a level for turning off a low-side switching device of the half-bridge on a condition that the voltage at the half-bridge output exceeds the voltage threshold.

10. The method of claim 8, further comprising controlling, by the monitoring circuit, the low-side drive signal such that the delay time is a minimum delay necessary to prevent shoot-through of the half-bridge.

11. The method of claim 8, wherein the delay time is a minimum delay necessary to prevent shoot-through of the half-bridge.

12. The method of claim 8, further comprising comparing, by the comparator, a signal representing current flowing through a high-side switching device of the half-bridge to a current threshold.

13. The method of claim 8, wherein the high-side output is in communication with a high-side switching device and the low-side output are in communication with a low-side switching device, wherein the high-side switching device, the low-side switching device, or both the low-side switching device and the high-side switching device comprise field effect transistors (FETs).

14. A half-bridge circuit comprising:
an input;
an output;
a low-side switching device configured to selectively connect or disconnect the output to ground based on a low-side drive signal;
a high-side switching device configured to selectively connect or disconnect the output to a power supply based on a high-side drive signal;
a signal circuit configured to convert a gate signal to a high-side drive signal and pass the high-side drive signal to a high-side output and convert the same gate signal to a low-side drive signal and pass the low-side drive signal to a low-side output, the signal circuit comprising a monitoring circuit configured to create a delay time that separates the transition of the high-side drive signal and the transition of the low-side drive signal at the low-side output, wherein the monitoring circuit comprises a comparator and the delay time enables the comparator to compare a voltage at the output to a reference voltage to confirm whether the high-side switching device is turned off; and
the comparator further configured to inhibit the low-side switching device from connecting the output to ground on a condition that a voltage at the output exceeds a voltage threshold.

15. The half-bridge circuit of claim 14, wherein the low-side switching device, the high-side switching device, or both the low-side switching device and the high-side switching device comprise field effect transistors (FETs).

16. The half-bridge circuit of claim 14, wherein the comparator controls the low-side switching device such that the delay time is a minimum delay necessary to prevent shoot-through.

17. The half-bridge circuit of claim 14, wherein the signal circuit generates the high-side drive signal such that the delay time is a minimum delay necessary to prevent shoot-through.

18. The half-bridge circuit of claim 14, wherein the comparator is configured to compare a signal representing current flowing through the high-side switching device to a current threshold.

19. The half-bridge circuit of claim 14, wherein the signal circuit generates the high-side drive signal based on the input such that the delay time is a minimum delay for preventing shoot-through of the half-bridge.

20. The half-bridge circuit of claim 14, wherein the comparator comprises a start signal input which inhibits the comparator on a condition that a start signal is supplied to the start signal input.

* * * * *